(12) United States Patent
Fan

(10) Patent No.: US 12,380,941 B2
(45) Date of Patent: Aug. 5, 2025

(54) POWER SUPPLY SWITCHING CIRCUIT AND MEMORY

(71) Applicant: CHANGXIN MEMORY TECHNOLOGIES, INC., Hefei (CN)

(72) Inventor: Yupeng Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 194 days.

(21) Appl. No.: 18/327,062

(22) Filed: Jun. 1, 2023

(65) Prior Publication Data

US 2023/0386554 A1 Nov. 30, 2023

Related U.S. Application Data

(63) Continuation of application No. PCT/CN2022/124357, filed on Oct. 10, 2022.

(30) Foreign Application Priority Data

May 25, 2022 (CN) .......................... 202210577063.8

(51) Int. Cl.
*G11C 11/00* (2006.01)
*G11C 11/4074* (2006.01)
(Continued)

(52) U.S. Cl.
CPC ........ *G11C 11/4074* (2013.01); *H03K 17/687* (2013.01); *H03K 19/00323* (2013.01); *H03K 19/20* (2013.01)

(58) Field of Classification Search
CPC ......... H03K 19/0013; H03K 19/01707; H03K 19/0175; H03K 19/017518;
(Continued)

(56) References Cited

U.S. PATENT DOCUMENTS 8,446,173 B1 * 5/2013 Faucher .......... H03K 19/017509
326/86
9,589,627 B1 3/2017 Wilson et al.
(Continued)

FOREIGN PATENT DOCUMENTS

CN 106452418 B 11/2019
CN 111725975 A 9/2020
(Continued)

OTHER PUBLICATIONS

Taiwan Patent Office, first office action Issued in Application No. 111133149, Jun. 29, 2023, 8 pages.
(Continued)

*Primary Examiner* — Thong Q Le
(74) *Attorney, Agent, or Firm* — Kilpatrick Townsend & Stockton LLP

(57) ABSTRACT

Embodiments provide a power supply switching circuit, which generates a first control signal jointly by utilizing a first input signal and a first drive signal opposite in phase to a second control signal, and generates the second control signal jointly by utilizing a second input signal and a second drive signal opposite in phase to the first control signal, such that time (i.e., overlap time) required for simultaneously turning on or off a first output subcircuit and a second output subcircuit is greatly reduced or even eliminated, effective output of an output node is implemented, and reliability of a device is improved. Furthermore, compared with eliminating the overlap time by means of delay, eliminating the overlap time by means of the power supply switching circuit is simple and reliable in control logic and is insensitive to process, which further improves the reliability of the device.

19 Claims, 5 Drawing Sheets

(51) Int. Cl.
*H03K 17/687* (2006.01)
*H03K 19/003* (2006.01)
*H03K 19/20* (2006.01)

(58) Field of Classification Search
CPC ....... H03K 19/017545; H03K 19/0185; H03K 19/018585; H03K 19/173; H03K 19/1733; H03K 2217/0036; H03K 2217/0081; H03K 3/017; H03K 3/0372; G11C 11/4074; G11C 11/4093; G11C 11/4096; G11C 11/40; G11C 11/4076; G11C 11/4087; G11C 5/14; G11C 5/147; G11C 7/222; G11C 11/34; G11C 11/401; G11C 11/4072; G11C 11/408; G11C 11/4082; G11C 11/4085; G11C 11/4091; G11C 16/06; G11C 16/30; G11C 19/28; G11C 2207/2227; G11C 5/02; G11C 5/06; G11C 5/143; G11C 5/145; G11C 5/148; G11C 7/00; G11C 7/10; G11C 7/1012; G11C 7/1048; G11C 7/1051; G11C 7/1057; G11C 7/106; G11C 7/1069; G11C 7/1084; G11C 7/1087; G11C 7/109; G11C 7/225; G11C 8/06

USPC ........................................................ 365/226
See application file for complete search history.

(56) References Cited

U.S. PATENT DOCUMENTS

2017/0012624 A1  1/2017  Miller
2020/0321959 A1  10/2020  Bhat et al.

FOREIGN PATENT DOCUMENTS

| CN | 213521831 U | 6/2021 |
| CN | 114095004 A | 2/2022 |
| JP | 2005304226 A | 10/2005 |
| TW | 201105014 A | 2/2011 |
| TW | 201729521 A | 8/2017 |

OTHER PUBLICATIONS

ISA State Intellectual Property Office of the People's Republic of China, International Search Report Issued in Application No. PCT/CN2022/124357, Feb. 20, 2023, WIPO, 7 pages.

* cited by examiner

POWER SUPPLY SWITCHING CIRCUIT AND MEMORY

CROSS REFERENCE TO RELATED APPLICATION

This application is a continuation of PCT/CN2022/124357, filed on Oct. 10, 2022, which claims priority to Chinese Patent Application No. 202210577063.8, titled "POWER SUPPLY SWITCHING CIRCUIT AND MEMORY" and filed on May 25, 2022, the entire contents of which are incorporated herein by reference.

TECHNICAL FIELD

The present disclosure relates to the field of integrated circuits, and more particularly, to a power supply switching circuit and a memory.

BACKGROUND

In an integrated circuit chip, a power supply switching circuit is configured to supply power to a circuit in a memory according to a timing sequence of an input signal. Existing power supply switching circuits generally use independent control logic to control clock overlap, or use standard non-overlap control logic to control the clock overlap. However, these two methods have complex control logic, low reliability and sensitive to process, and thus cannot meet requirements.

SUMMARY

An embodiment of the present disclosure provides a power supply switching circuit, which includes: a first output subcircuit configured to provide a first power supply voltage signal to an output node in response to a first control signal; a first control subcircuit coupled to the first output subcircuit, the first control subcircuit being configured to generate the first control signal in response to a first drive signal and a first input signal; a second output subcircuit configured to provide a second power supply voltage signal to the output node in response to a second control signal; and a second control subcircuit coupled to the second output subcircuit, the second control subcircuit being configured to generate the second control signal in response to a second drive signal and a second input signal. The first input signal is opposite in phase to the second input signal, the first drive signal is opposite in phase to the second control signal, and the second drive signal is opposite in phase to the first control signal.

Embodiments of the present disclosure also provide a memory, which includes the power supply switching circuit as described above.

DETAILED DESCRIPTION

A power supply switching circuit and a memory provided by embodiments of the present disclosure will be described in detail below with reference to the accompanying drawings.

Figure 1:
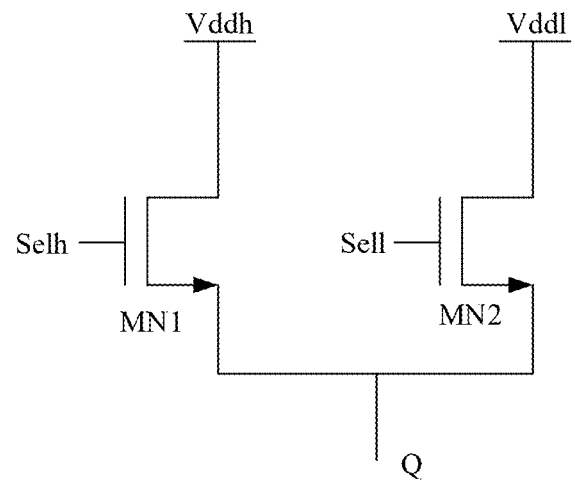
FIG. 1 is a schematic circuit diagram of a power supply switching circuit provided by a first embodiment of the present disclosure.

FIG. 1 is a schematic circuit diagram of a power supply switching circuit provided by a first embodiment of the present disclosure. Referring to FIG. 1, the power supply switching circuit includes a first output subcircuit and a second output subcircuit. In this embodiment, the first output subcircuit is a first NMOS transistor MN1, and the second output subcircuit is a second NMOS transistor MN2. The first output subcircuit is configured to provide a first power supply voltage signal Vddh to an output node Q in response to a first control signal Selh, and the second output subcircuit is configured to provide a second power supply voltage signal Vddl to the output node Q in response to a second control signal Sell.

Figure 2:
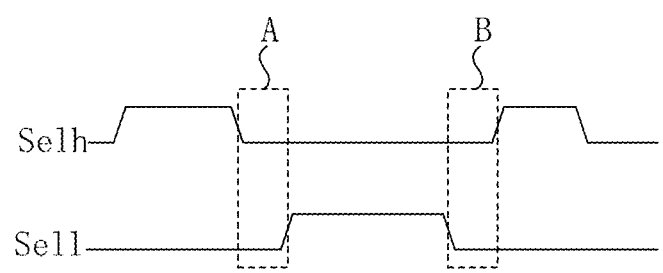
FIG. 2 is a timing diagram of the schematic circuit diagram shown in FIG. 1.

The power supply switching circuit provided by this embodiment is affected by a timing sequence of the first control signal Selh and the second control signal Sell, and thus the first NMOS transistor MN1 (i.e., the first output subcircuit) and the second NMOS transistor MN2 (i.e., the second output subcircuit) may be simultaneously turned on or off, which adversely affects effective output of the output node Q. For example, FIG. 2 is a timing diagram of the first control signal Selh and the second control signal Sell in the schematic circuit diagram shown in FIG. 1. Referring to FIG. 2, there exists a case where the first control signal Selh and the second control signal Sell are both low level signals (as shown in regions circled by a dashed line box A and a dashed line box B in the figure). In this case, both the first NMOS transistor MN1 (i.e., the first output subcircuit) and the second NMOS transistor MN2 (i.e., the second output subcircuit) are in an off state, which results in absence of effective output of the output node Q, and thus reduces reliability of the power supply switching circuit.

For the above reasons, a second embodiment of the present disclosure also provides a power supply switching circuit, which includes: a first output subcircuit configured to provide a first power supply voltage signal to an output node in response to a first control signal; a first control subcircuit coupled to the first output subcircuit, the first control subcircuit being configured to generate the first control signal in response to a first drive signal and a first input signal; a second output subcircuit configured to provide a second power supply voltage signal to the output node in response to a second control signal; and a second control subcircuit coupled to the second output subcircuit, the second control subcircuit being configured to generate the second control signal in response to a second drive signal and a second input signal. The first input signal is opposite in phase to the second input signal, the first drive signal is opposite in phase to the second control signal, and the second drive signal is opposite in phase to the first control signal.

The power supply switching circuit provided by the second embodiment of the present disclosure generates the first control signal jointly by utilizing the first input signal and the first drive signal opposite in phase to the second control signal, and generates the second control signal jointly by utilizing the second input signal and the second drive signal opposite in phase to the first control signal, such that time (i.e., overlap time) required for simultaneously turning on or off the first output subcircuit and the second output subcircuit is greatly reduced or even eliminated, effective output of the output node is implemented, and reliability of a device is improved. Furthermore, compared with eliminating the overlap time by means of delay, eliminating the overlap time by means of the power supply switching circuit of the present disclosure is simple and reliable in control logic and is insensitive to process, which further improves the reliability of the device.

Structures of the power supply switching circuit provided by the second embodiment of the present disclosure are described in detail below.

Figure 3:
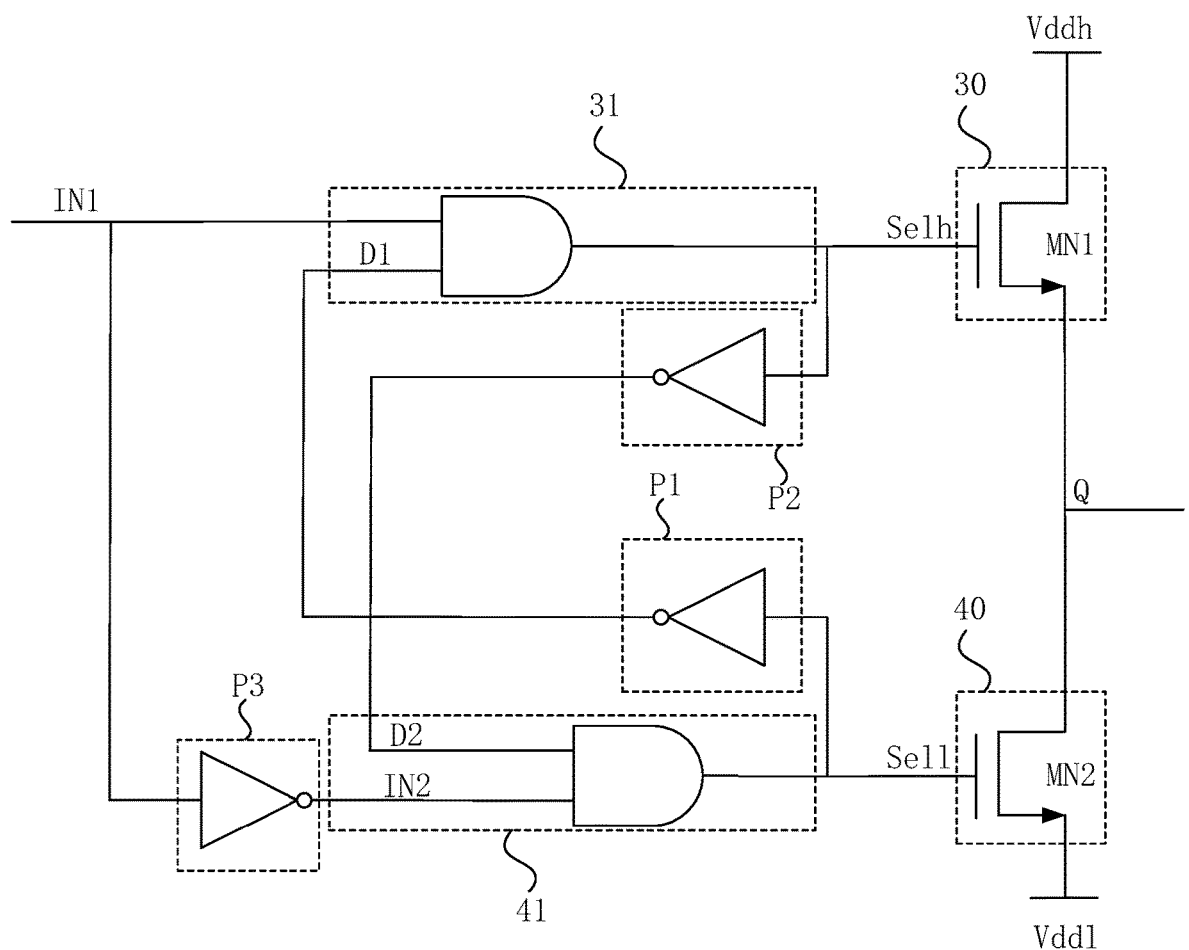
FIG. 3 is a schematic circuit diagram of a power supply switching circuit provided by a second embodiment of the present disclosure.

FIG. 3 is a schematic circuit diagram of the power supply switching circuit provided by the second embodiment of the present disclosure. Referring to FIG. 3, the power supply switching circuit includes a first output subcircuit 30, a first control subcircuit 31, a second output subcircuit 40, and a second control subcircuit 41.

The first output subcircuit 30 is configured to provide the first power supply voltage signal Vddh to the output node Q in response to the first control signal Selh. In this embodiment, the first output subcircuit 30 includes a first NMOS transistor MN1, where a gate of the first NMOS transistor MN1 is configured to receive the first control signal Selh, a first electrode of the first NMOS transistor MN1 is configured to receive the first power supply voltage signal Vddh, and a second electrode of the first NMOS transistor MN1 is connected to the output node Q. When the first NMOS transistor MN1 is turned on, the output node Q outputs the first power supply voltage signal Vddh. The first power supply voltage signal Vddh may be a device operating voltage signal.

The first control subcircuit 31 is coupled to the first output subcircuit 30 to generate the first control signal Selh in response to the first drive signal D1 and the first input signal IN1. That is, the first drive signal D1 and the first input signal IN1 serve as input signals to the first control subcircuit 31, which outputs the first control signal Selh.

In this embodiment, the first control subcircuit 31 includes a first logic gate circuit configured to perform logic AND operation on the first input signal IN1 and the first drive signal D1 and to generate the first control signal Selh. For example, in this embodiment, the first logic gate circuit includes a first AND gate, where a first input terminal of the first AND gate is configured to receive the first input signal IN1, a second input terminal of the first AND gate is configured to receive the first drive signal D1, and an output terminal of the first AND gate is configured to output the first control signal Selh.

In the second embodiment, the first logic gate circuit performs logic AND operation on the first input signal IN1 and the first drive signal D1 through the first AND gate. In some other embodiments of the present disclosure, the first logic gate circuit may also include other logic circuits configured to perform logic AND operation on the first input signal IN1 and the first drive signal D1.

Figure 4:
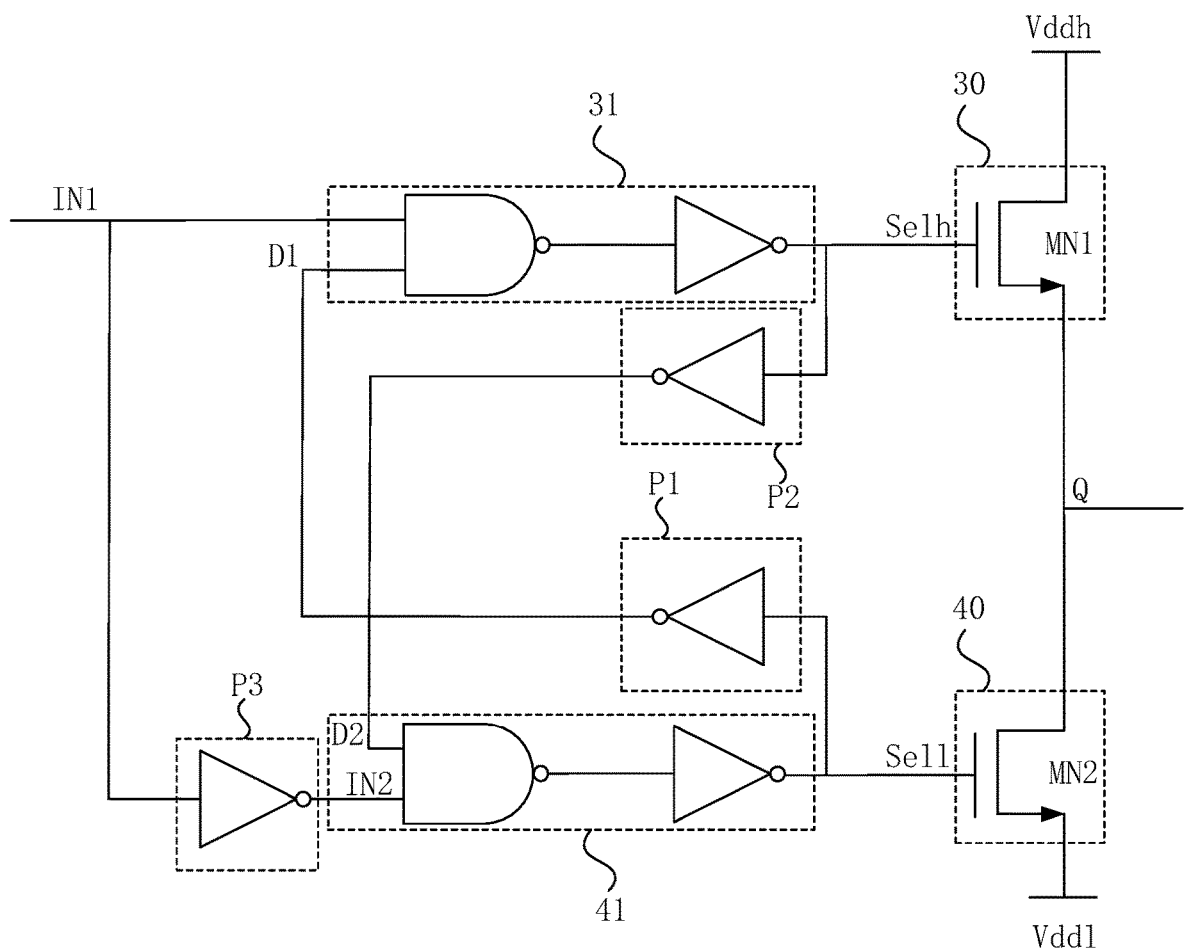
FIG. 4 is a schematic circuit diagram of a power supply switching circuit provided by a third embodiment of the present disclosure.

For example, referring to FIG. 4, in a third embodiment of the present disclosure, the first logic gate circuit includes a first NAND gate and a first NOT gate connected in series, where a first input terminal of the first NAND gate is configured to receive the first input signal IN1, a second input terminal of the first NAND gate is configured to receive the first drive signal D1, an output signal from an output terminal of the first NAND gate serves as an input signal of an input terminal of the first NOT gate, and an output terminal of the first NOT gate is configured to output the first control signal Selh. In the third embodiment, the first logic gate circuit performs logic AND operation on the first input signal IN1 and the first drive signal D1 through the first NAND gate and the first NOT gate connected in series.

The second output subcircuit 40 is configured to provide a second power supply voltage signal Vddl to the output node Q in response to the second control signal Sell. In this embodiment, the second output subcircuit 40 includes a second NMOS transistor MN2, where a gate of the second NMOS transistor is configured to receive the second control signal Sell, a first electrode of the second NMOS transistor MN2 is configured to receive the second power supply voltage signal Vddl, and a second electrode of the second NMOS transistor MN2 is connected to the output node Q. When the second NMOS transistor MN2 is turned on, the output node Q outputs the second power supply voltage signal Vddl. The second power supply voltage signal Vddl may be a grounding terminal voltage signal.

The second control subcircuit 41 is coupled to the second output subcircuit 40 to generate the second control signal Sell in response to the second drive signal D2 and the second input signal IN2. That is, the second drive signal D2 and the second input signal IN2 serve as input signals of the second control subcircuit 41, which outputs the second control signal Sell. The first input signal IN1 is opposite in phase to the second input signal IN2, the first drive signal D1 is opposite in phase to the second control signal Sell, and the second drive signal D2 is opposite in phase to the first control signal Selh.

In this embodiment, the second control subcircuit 41 includes a second logic gate circuit configured to perform logic AND operation on the second input signal IN2 and the second drive signal D2 and to generate the second control signal Sell. For example, in this embodiment, the second logic gate circuit includes a third phase inverting subcircuit P3 and a second AND gate, where an input terminal of the third phase inverting subcircuit P3 is configured to receive the first input signal IN1, an output terminal of the third phase inverting subcircuit P3 is configured to output the second input signal IN2, a first input terminal of the second AND gate is configured to receive the second input signal IN2, a second input terminal of the second AND gate is configured to receive the second drive signal D2, and an output terminal of the second AND gate is configured to output the second control signal Sell. The third phase inverting subcircuit P3 includes an odd number of inverters connected in series. For example, in this embodiment, the third phase inverting subcircuit P3 includes only one inverter, while in other embodiments, the third phase inverting subcircuit P3 may include three inverters connected in series.

In the second embodiment, the second logic gate circuit implements an objective of inverting the first input signal IN1 through the third phase inverting subcircuit P3, and implements an objective of performing logic AND operation on the second input signal IN2 and the second drive signal D2 through the second AND gate. In some other embodiments of the present disclosure, the first logic gate circuit may also include other logic circuits configured to perform logic AND operation on the second input signal IN2 and the second drive signal D2.

For example, referring to FIG. 4, in the third embodiment of the present disclosure, the second logic gate circuit includes a fourth phase inverting subcircuit P4 and a second NAND gate and a second NOT gate connected in series, where an input terminal of the fourth phase inverting subcircuit P4 is configured to receive the first input signal, an output terminal of the fourth phase inverting subcircuit P4 is configured to output the second input signal IN2, a first input terminal of the second NAND gate is configured to receive the second input signal IN2, a second input terminal of the second NAND gate is configured to receive the second drive signal D2, an output signal from an output terminal of the second NAND gate serves as an input signal of an input terminal of the second NAND gate, and an output terminal of the second NOT gate is configured to output the second control signal Sell. In the third embodiment, the second logic gate circuit implements the objective of inverting the first input signal IN1 through the fourth phase inverting subcircuit P4, and implements the objective of performing logic AND operation on the second input signal IN2 and the second drive signal D2 through the first NAND gate and the first NOT gate connected in series. The fourth phase inverting subcircuit P4 includes an odd number of inverters connected in series. For example, in this embodiment, the fourth phase inverting subcircuit P4 includes only one inverter, while in other embodiments, the fourth phase inverting subcircuit P4 may include three inverters connected in series.

In some embodiments of the present disclosure, the first logic gate circuit and the second logic gate circuit adopt the same logic circuit, to avoid deviation between the first control signal and the second control signal caused by difference between the first control subcircuit 31 and the second control subcircuit 41, thereby further improving control accuracy for the first control signal and the second control signal, and reducing the time required for simultaneously turning on or off the first output subcircuit and the second output subcircuit.

In some embodiments of the present disclosure, the first output subcircuit 30 and the second output subcircuit 40 include the same type of transistor such as an NMOS transistor or a PMOS transistor, to further avoid simultaneously turning on or off the first output subcircuit 30 and the second output subcircuit 40.

In the embodiments of the present disclosure, a mode for forming a drive signal is also provided. For example, with continued reference to FIG. 3, in the second embodiment of the present disclosure, the power supply switching circuit further includes a first phase inverting subcircuit P1 and a second phase inverting subcircuit P2.

The first phase inverting subcircuit P1 is coupled between an output terminal of the second control subcircuit 41 and one input terminal of the first output subcircuit 30, and is configured to generate the first drive signal D1 in response to the second control signal Sell. That is, in this embodiment, the second control signal Sell is inverted by the first phase inverting subcircuit P1 to form the first drive signal D1.

In an embodiment of the present disclosure, the first phase inverting subcircuit P1 includes an odd number of first inverters connected in series. For example, in the second embodiment of the present disclosure, the first phase inverting subcircuit P1 includes one first inverter, and the second control signal Sell is inverted by the first inverter to form the first drive signal D1. In other embodiments of the present disclosure, the first phase inverting subcircuit P1 may include an odd number of, such as three or five, first inverters.

In an embodiment of the present disclosure, the first inverter includes a PMOS transistor and an NMOS transistor, where a dimension of the NMOS transistor of at least one of the first inverters is greater than that of the PMOS transistor, such that the first drive signal D1 cannot be generated to a first input terminal of the first control subcircuit 31 unless after the second control signal Sell becomes sufficiently low (that is, the second output subcircuit 40 has been turned off). Only in this case can the first control signal Selh be pulled high, the first output subcircuit 30 is turned on, and the power supply switching circuit is turned on. However, when the second control signal Sell does not become sufficiently low (that is, the second output subcircuit 40 has not been turned off), in this case, if the first drive signal D1 is generated to the first input terminal of the first control subcircuit 31, both the first output subcircuit 30 and the second output subcircuit 40 may be turned on. That is, there exists a case where the first output subcircuit 30 and the second output subcircuit 40 of the power supply switching circuit may be turned on simultaneously.

Figure 5:
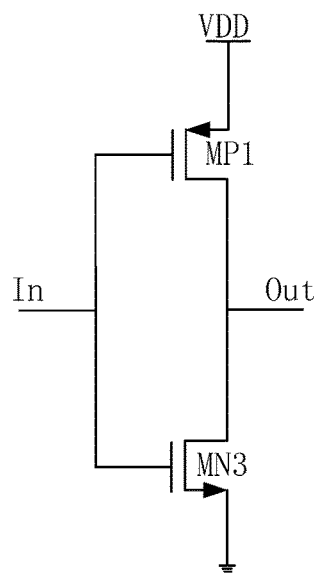
FIG. 5 is a schematic circuit diagram of a first inverter provided by the third embodiment of the present disclosure.

In some embodiments, referring to FIG. 5, the first inverter includes a PMOS transistor MP1 and an NMOS transistor MN3. The second control signal Sell serves as an input signal of the first inverter, that is, the second control signal Sell serves as a control signal to the PMOS transistor MP1 and the NMOS transistor MN3. A first electrode of the PMOS transistor MP1 is configured to receive a power supply voltage signal VDD, a second electrode of the PMOS transistor MP1 is connected to an output terminal of the first inverter, a first electrode of the NMOS transistor MN3 is grounded, and a second electrode of the NMOS transistor MN3 is connected to the output terminal of the first inverter. The dimension of the NMOS transistor MN3 is greater than that of the PMOS transistor MP1. That is, a width-to-length ratio of the NMOS transistor MN3 is greater than that of the PMOS transistor MP1, to further avoid the situation that the first output subcircuit 30 and the second output subcircuit 40 of the power supply switching circuit are turned on simultaneously.

The second phase inverting subcircuit P2 is coupled between an output terminal of the first control subcircuit 31 and one input terminal of the second output subcircuit 40, and the second phase inverting subcircuit P2 is configured to generate the second drive signal D2 in response to the first control signal Selh.

In an embodiment of the present disclosure, the second phase inverting subcircuit P2 includes an odd number of second inverters connected in series. For example, in the second embodiment of the present disclosure, the second phase inverting subcircuit P2 includes one second inverter, and the first control signal Selh is inverted by the second inverter to form the second drive signal D2. In other embodiments of the present disclosure, the second phase inverting subcircuit P2 may include an odd number of, such as three or five, first inverters.

In an embodiment of the present disclosure, the second inverter includes a PMOS transistor and an NMOS transistor, where a dimension of the NMOS transistor of at least one of the second inverters is greater than that of the PMOS transistor, such that the second drive signal D2 cannot be generated to the first input terminal of the second control subcircuit 41 unless after the first control signal Selh becomes sufficiently low (that is, the first output subcircuit 30 has been turned off). Only in this case can the second control signal Sell be pulled high, the second output subcircuit 40 is turned on, and the power supply switching circuit is turned on. However, when the first control signal Selh does not become sufficiently low (that is, the first output subcircuit 30 has not been turned off), in this case, if the second drive signal D2 is generated to the first input terminal of the second control subcircuit 41, both the first output subcircuit 30 and the second output subcircuit 40 may be turned on. That is, there exists a case where the first output subcircuit 30 and the second output subcircuit 40 of the power supply switching circuit may be turned on simultaneously.

In an embodiment of the present disclosure, number of the first inverters included in the first phase inverting subcircuit P1 is equal to that of the second inverters included in the second phase inverting subcircuit P2, to prevent the first output subcircuit 30 and the second output subcircuit 40 from being simultaneously turned on or off due to difference between the first phase inverting subcircuit P1 and the second phase inverting sub circuit P2.

Figure 6:
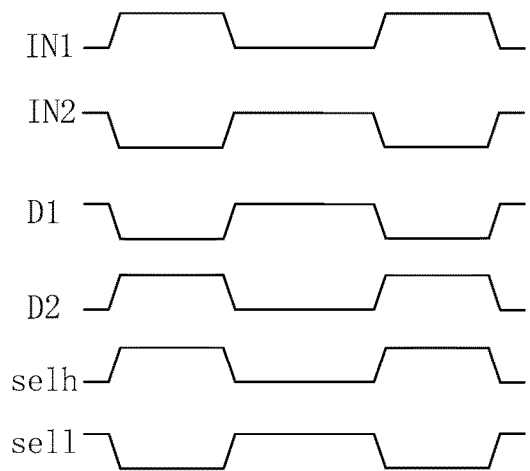
FIG. 6 is a timing diagram of the power supply switching circuit provided by the second embodiment of the present disclosure.

FIG. 6 is a timing diagram of the power supply switching circuit provided by the second embodiment of the present disclosure. Referring to FIG. 6, there does not exist a case where the first control signal Selh and the second control signal Sell are simultaneously turned on or off, effective output of the output node is implemented, and reliability of a device is improved.

Figure 7:
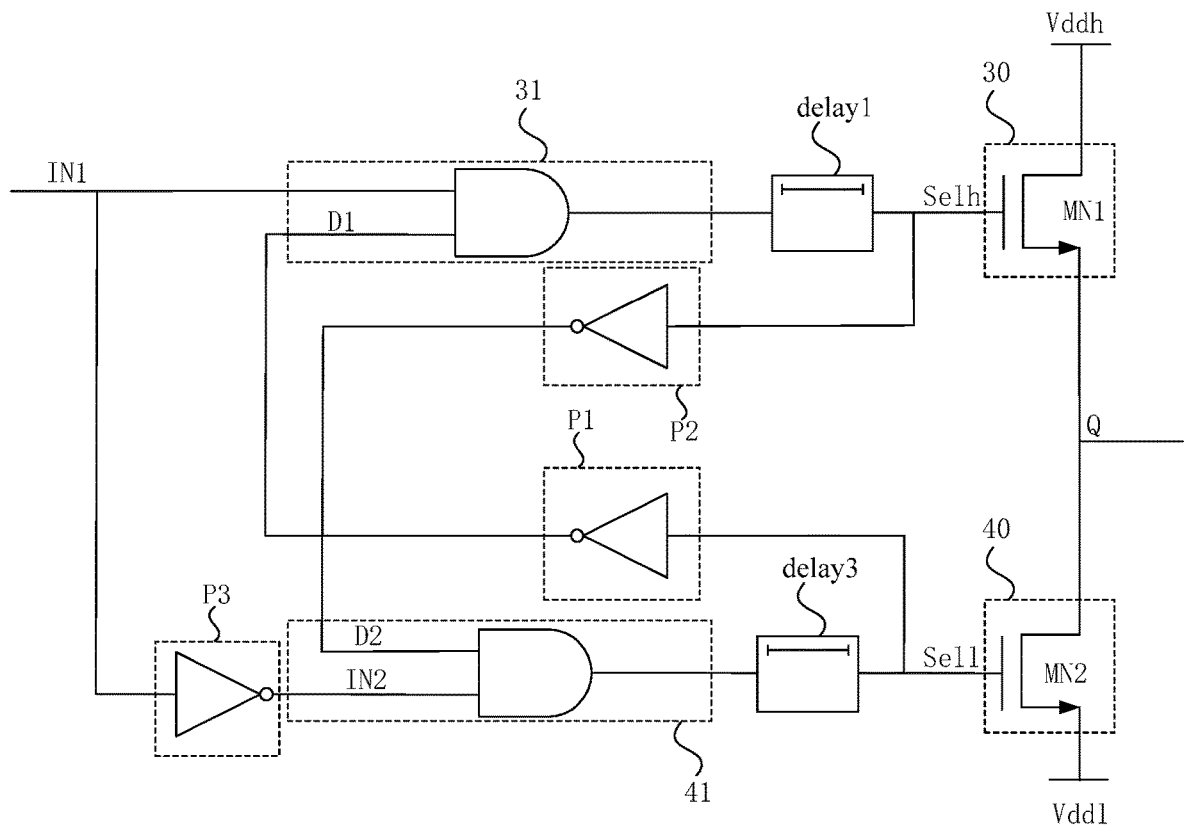
FIG. 7 is a schematic circuit diagram of a power supply switching circuit provided by a fourth embodiment of the present disclosure.

A fourth embodiment of the present disclosure also provides a power supply switching circuit, which further reduces the overlap time between the first output subcircuit 30 and the second output subcircuit 40 by means of a delay subcircuit. In some embodiments, referring to FIG. 7, which is a schematic circuit diagram of the power supply switching circuit provided by the fourth embodiment of the present disclosure, differences between the fourth embodiment and the second embodiment lie in that the power supply switching circuit further includes a first delay subcircuit delay 1, which is coupled between the first control subcircuit 31 and the first output subcircuit 30. In some embodiments, an input terminal of the first delay subcircuit delay 1 is connected to the output terminal of the first control subcircuit 31, and an output terminal of the first delay subcircuit delay 1 is connected to the first output subcircuit 30 to further reduce the overlap time between the first output subcircuit 30 and the second output subcircuit 40. The first delay subcircuit delay 1 may be an even number of series-connected inverters or flip-flops or shift registers, etc.

In the fourth embodiment of the present disclosure, the power supply switching circuit further includes a third delay subcircuit delay 3 coupled between the second control subcircuit 41 and the second output subcircuit 40. In some embodiments, an input terminal of the third delay subcircuit delay 3 is connected to the output terminal of the second control subcircuit 41, and an output terminal of the second delay subcircuit delay 2 is connected to the second output subcircuit 40 to further reduce the overlap time between the first output subcircuit 30 and the second output subcircuit 40. The second delay subcircuit delay 2 may be an even number of series-connected inverters or flip-flops or shift registers, etc.

A fifth embodiment of the present disclosure also provides a power supply switching circuit, which further reduces the overlap time between the first output subcircuit 30 and the second output subcircuit 40 by means of a delay subcircuit.

Figure 8:
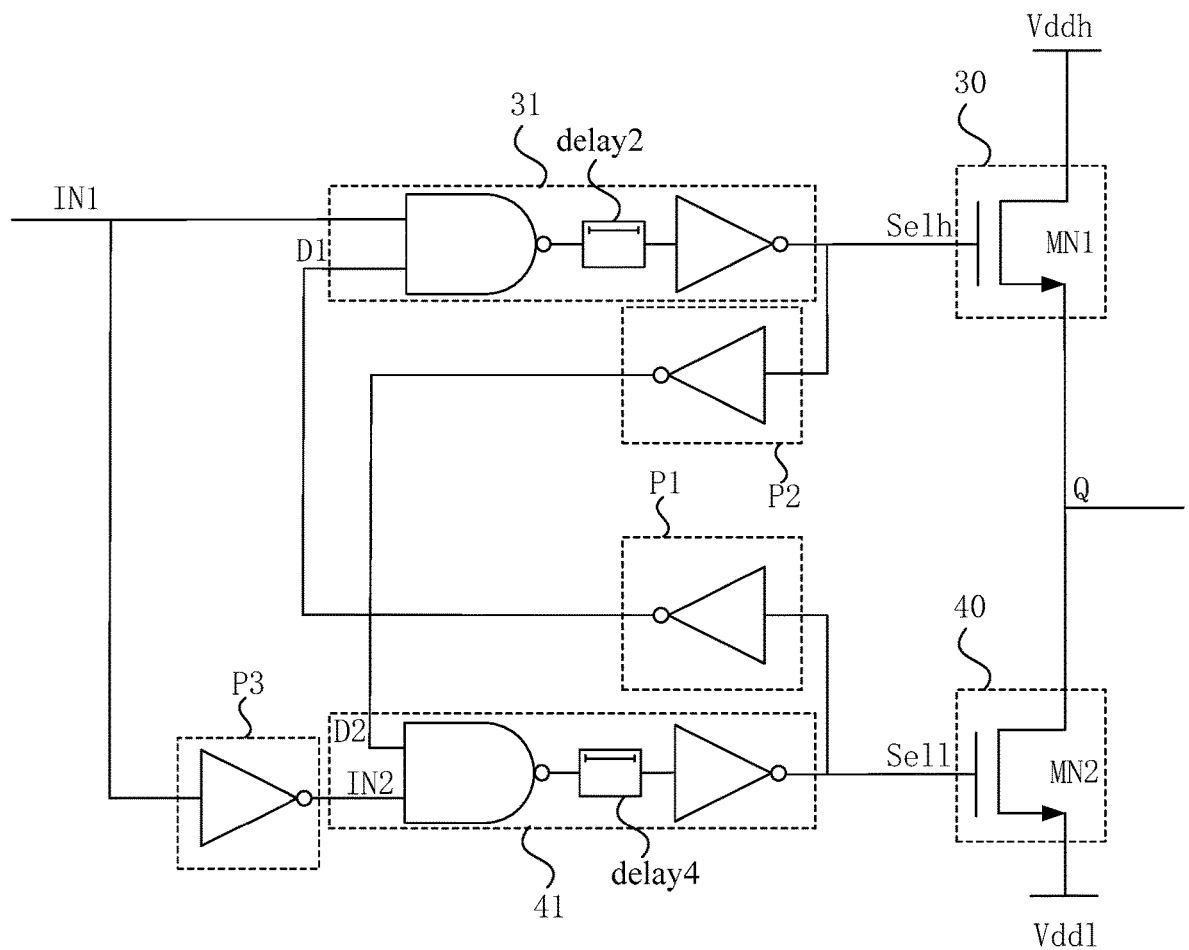
FIG. 8 is a schematic circuit diagram of a power supply switching circuit provided by a fifth embodiment of the present disclosure.

In some embodiments, referring to FIG. 8, which is a schematic circuit diagram of the power supply switching circuit provided by the fifth embodiment of the present disclosure, the fifth embodiment is different from the third embodiment in that the power supply switching circuit further includes a second delay subcircuit delay 2, which is coupled between the first NAND gate circuit and the first NOT gate circuit. In some embodiments, an input terminal of the second delay subcircuit delay 2 is connected to an output terminal of the first NAND gate circuit, and an output terminal of the second delay subcircuit delay 2 is connected to an input terminal of the first NOT gate circuit to further reduce the overlap time between the first output subcircuit 30 and the second output subcircuit 40.

In the fifth embodiment of the present disclosure, the power supply switching circuit further includes a fourth delay subcircuit delay 4 coupled between the second NAND gate circuit and the second NOT gate circuit. In some embodiments, an input terminal of the fourth delay subcircuit delay 4 is connected to an output terminal of the first NAND gate circuit, and an output terminal of the fourth delay subcircuit delay 4 is connected to an input terminal of the second NOT gate circuit to further reduce the overlap time between the first output subcircuit 30 and the second output subcircuit 40.

Embodiments of the present disclosure also provide a memory, which includes the power supply switching circuit as described above. For example, the memory may be a DRAM memory. The memory generates the first control signal jointly by utilizing the first input signal of the power supply switching circuit and the first drive signal opposite in phase to the second control signal, and generates the second control signal jointly by utilizing the second input signal and the second drive signal opposite in phase to the first control signal, such that time (i.e., overlap time) required for simultaneously turning on or off the first output subcircuit and the second output subcircuit is greatly reduced or even eliminated, effective output of the output node of the power supply switching circuit is implemented, and reliability of the device is improved. Furthermore, compared with eliminating the overlap time by means of delay, eliminating the overlap time by means of the power supply switching circuit of the present disclosure is simple and reliable in control logic and is insensitive to process, which further improves the reliability of the device.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A power supply switching circuit comprising:
a first output subcircuit configured to provide a first power supply voltage signal to an output node in response to a first control signal;
a first control subcircuit coupled to the first output subcircuit, the first control subcircuit being configured to generate the first control signal in response to a first drive signal and a first input signal;
a second output subcircuit configured to provide a second power supply voltage signal to the output node in response to a second control signal; and
a second control subcircuit coupled to the second output subcircuit, the second control subcircuit being configured to generate the second control signal in response to a second drive signal and a second input signal; wherein the first input signal is opposite in phase to the second input signal, the first drive signal is opposite in phase to the second control signal, and the second drive signal is opposite in phase to the first control signal;

wherein the first control subcircuit comprises a first logic gate circuit configured to perform logic AND operation on the first input signal and the first drive signal.

2. The power supply switching circuit according to claim 1, further comprising:

a first phase inverting subcircuit coupled between an output terminal of the second control subcircuit and one input terminal of the first output subcircuit, the first phase inverting subcircuit being configured to generate the first drive signal in response to the second control signal; and a second phase inverting subcircuit coupled between an output terminal of the first control subcircuit and one input terminal of the second output subcircuit, the second phase inverting subcircuit being configured to generate the second drive signal in response to the first control signal.

3. The power supply switching circuit according to claim 2, wherein the first phase inverting subcircuit comprises an odd number of first inverters connected in series.

4. The power supply switching circuit according to claim 3, wherein each of the first inverter comprises a PMOS transistor and an NMOS transistor, and a dimension of the NMOS transistor of at least one of the first inverters is greater than a dimension of the PMOS transistor.

5. The power supply switching circuit according to claim 2, wherein the second phase inverting subcircuit comprises an odd number of second inverters connected in series.

6. The power supply switching circuit according to claim 5, wherein each of the second inverter comprises a PMOS transistor and an NMOS transistor, and a dimension of the NMOS transistor of at least one of the second inverters is greater than a dimension of the PMOS transistor.

7. The power supply switching circuit according to claim 2, wherein number of first inverters comprised in the first phase inverting subcircuit is equal to number of second inverters comprised in the second phase inverting subcircuit.

8. The power supply switching circuit according to claim 1, wherein the first output subcircuit comprises a first NMOS transistor, a gate of the first NMOS transistor being configured to receive the first control signal, a first electrode of the first NMOS transistor being configured to receive the first power supply voltage signal, and a second electrode of the first NMOS transistor being connected to the output node; and the second output subcircuit comprises a second NMOS transistor, a gate of the second NMOS transistor being configured to receive the second control signal, a first electrode of the second NMOS transistor being configured to receive the second power supply voltage signal, and a second electrode of the second NMOS transistor being connected to the output node.

9. The power supply switching circuit according to claim 1, wherein the first logic gate circuit comprises a first AND gate, a first input terminal of the first AND gate being configured to receive the first input signal, a second input terminal of the first AND gate being configured to receive the first drive signal, and an output terminal of the first AND gate being configured to output the first control signal.

10. The power supply switching circuit according to claim 1, further comprising a first delay subcircuit coupled between the first control subcircuit and the first output subcircuit.

11. The power supply switching circuit according to claim 1, wherein the first logic gate circuit comprises a first NAND gate and a first NOT gate connected in series, a first input terminal of the first NAND gate being configured to receive the first input signal, a second input terminal of the first NAND gate being configured to receive the first drive signal, and an output terminal of the first NOT gate being configured to output the first control signal.

12. The power supply switching circuit according to claim 11, further comprising a second delay subcircuit coupled between the first NAND gate circuit and the first NOT gate circuit.

13. The power supply switching circuit according to claim 1, wherein the second control subcircuit comprises a second logic gate circuit configured to perform logic AND operation on the second input signal and the second drive signal.

14. The power supply switching circuit according to claim 13, wherein the second logic gate circuit comprises a third phase inverting subcircuit and a second AND gate, an input terminal of the third phase inverting subcircuit being configured to receive the first input signal, an output terminal of the third phase inverting subcircuit being configured to output the second input signal, a first input terminal of the second AND gate being configured to receive the second input signal, a second input terminal of the second AND gate being configured to receive the second drive signal, and an output terminal of the second AND gate being configured to output the second control signal.

15. The power supply switching circuit according to claim 1, further comprising a third delay subcircuit coupled between the second control subcircuit and the second output subcircuit.

16. The power supply switching circuit according to claim 13, wherein the second logic gate circuit comprises a fourth phase inverting subcircuit and a second NAND gate and a second NOT gate connected in series, an input terminal of the fourth phase inverting subcircuit being configured to receive the first input signal, an output terminal of the fourth phase inverting subcircuit being configured to output the second input signal, a first input terminal of the second NAND gate being configured to receive the second input signal, a second input terminal of the second NAND gate being configured to receive the second drive signal, and an output terminal of the second NOT gate being configured to output the second control signal.

17. The power supply switching circuit according to claim 16, further comprising a fourth delay subcircuit coupled between the second NAND gate circuit and the second NOT gate circuit.

18. The power supply switching circuit according to claim 1, wherein the first power supply voltage signal is a device operating voltage signal, and the second power supply voltage signal is a grounding terminal voltage signal.

19. A memory comprising the power supply switching circuit according to claim 1.

* * * * *